(12) United States Patent
Parker et al.

(10) Patent No.: US 7,161,369 B2
(45) Date of Patent: Jan. 9, 2007

(54) METHOD AND APPARATUS FOR A WOBBLE FIXTURE PROBE FOR PROBING TEST ACCESS POINT STRUCTURES

(75) Inventors: Kenneth P. Parker, Fort Collins, CO (US); Richard W. Rivas, Sr., Vancouver, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 34 days.

(21) Appl. No.: 10/978,100

(22) Filed: Oct. 29, 2004

(65) Prior Publication Data

US 2006/0103405 A1    May 18, 2006

(51) Int. Cl.
*G01R 1/067* (2006.01)
(52) U.S. Cl. .................... 324/761; 324/757
(58) Field of Classification Search ................. None
See application file for complete search history.

(56) References Cited

U.S. PATENT DOCUMENTS

| | | | | |
|---|---|---|---|---|
| 3,274,534 A | * | 9/1966 | Shortridge | 439/700 |
| 3,435,168 A | * | 3/1969 | Cooney | 200/266 |
| 3,753,103 A | * | 8/1973 | Tetreault et al. | 324/72.5 |
| 4,397,519 A | * | 8/1983 | Cooney | 439/824 |
| 4,438,397 A | * | 3/1984 | Katz | 324/761 |
| 4,597,622 A | * | 7/1986 | Coe | 439/421 |
| 5,801,544 A | * | 9/1998 | Swart et al. | 324/761 |
| 5,993,269 A | * | 11/1999 | Ito | 439/824 |
| 6,570,399 B1 | * | 5/2003 | Yeghiayan et al. | 324/761 |
| 6,696,850 B1 | * | 2/2004 | Sanders | 324/761 |

* cited by examiner

*Primary Examiner*—Ernest Karlsen (57) ABSTRACT

A method and apparatus for a wiping fixture probe for cleaning oxides, residues or other contaminants from the surface of a solder bead probe and probing a solder bead probe on a printed circuit board during in-circuit testing.

6 Claims, 12 Drawing Sheets

METHOD AND APPARATUS FOR A WOBBLE FIXTURE PROBE FOR PROBING TEST ACCESS POINT STRUCTURES

REFERENCE TO RELATED PATENT DOCUMENTS

The subject matter of this patent application is related to that of U.S. patent application Ser. No. 10/670,649 entitled Printed Circuit Board Test Access Point Structures And Methods For Making The Same filed Sep. 24, 2003 by Kenneth P. Parker, Ronald J. Peiffer and Glen E. Leinbach and assigned to Agilent Technologies, Inc., which is hereby incorporated herein by reference. The subject matter of this patent application is also related to that of U.S. patent application Ser. No. 10/972,829 entitled Method And Apparatus For Manufacturing And Probing Printed Circuit Board Test Access Point Structures filed Oct. 25, 2004 by Kenneth P. Parker and Chris R. Jacobsen and assigned to Agilent Technologies, Inc., which is hereby incorporated herein by reference.

BACKGROUND OF THE INVENTION

Printed circuit assemblies (PCA's) are typically tested after manufacture to verify the continuity of traces between pads and vias on the board and to verify that components loaded on the PCA perform within specifications. Such printed circuit assembly testing is generally performed with automated in-circuit testers or ICT's and requires complex tester resources. The tester hardware must generally be capable of probing conductive pads, vias and traces on the board under test.

In-circuit testers (ICT) have traditionally used "bed-of-nails" (BON) access to gain electrical connectivity to circuit wiring (traces, nets, pads) for control and observation capability needed for testing. The Agilent 3070 is one typical in-circuit tester and is available from Agilent Technologies, Inc. of Palo Alto, Calif. This necessitates having access targets within the layout of circuit nets that can be targets for ICT probes. Test access points are usually circular targets with 28 to 35 mil diameter that are connected to traces on the printed circuit board. In some cases these targets are deliberately added test pads, and in other cases the targets are "via" pads surrounding vias already provided in the printed circuit.

Lower diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Yet another industry trend is to use higher and higher speed logic families. One Megahertz (MHz) designs became ten MHz designs, then 100 MHz designs, and are now reaching the Gigahertz domain. The increases in logic speed necessitate industry attention to board layout rules for higher-speed interconnects. The goal of these rules is to create a controlled impedance pathway that minimizes noise, crosstalk and signal reflections. Printed circuit boards traces that carry high-speed signals tend to have critical layout requirements and require controlled characteristic impedances. When traditional test probe targets are added, this causes discontinuities in the controlled impedances and may damage signal fidelity.

Figure 1A:
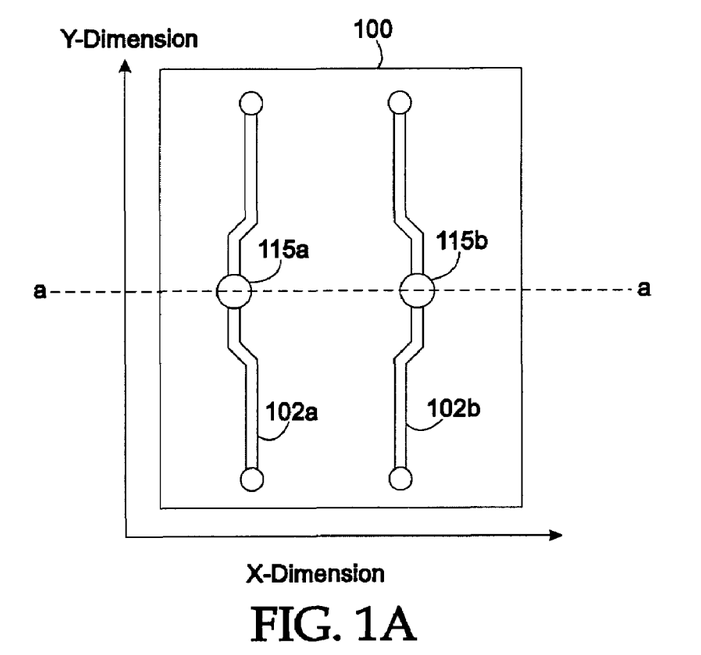
FIG. 1A is a top view of a conventional printed circuit board with traces showing the x- and y-dimensions in the x-, y-, z-coordinate system.

FIG. 1A illustrates a classic pair of differential transmission signal traces 102a, 102b on a portion of a printed circuit board 100. As illustrated, the printed circuit board 100 is formed as a plurality of layers. In the illustrative embodiment, the printed circuit board 100 includes a ground plane 104 layered over a substrate 105, a dielectric 103 layered over the ground plane 104, traces 102a, 102b layered over the dielectric 103, a solder mask 106 layered exposed surfaces of the dielectric 103, and test access targets 115a and 115b. In such a layout, there are a number of critical parameters that affect the impedance of the signal path. These parameters include trace width 110, trace separation 111, trace thickness 112, and dielectric constants of the solder mask and board material. These parameters influence the inductance, capacitance, and resistance (skin effect and DC) of the traces, which combine to determine the transmission impedance. It is generally desirable to control this value across the entire run of each trace 102a, 102b.

In some higher speed designs it is also important to control the symmetry of the traces. However, routing signals on a crowded printed circuit board necessitates curves and bends in the path, which makes matching lengths and symmetries more difficult. In some cases, series components (such as series terminations or DC blocking capacitors) may be included in the path, and these have dimensions that differ from the layout parameters. Signals may also have to traverse connectors, which add to the difficulties.

Another trend is toward higher and higher density boards, which are also layout critical. When traditional test probe targets are added to a high-density board, the board layout is generally disturbed, in which adding test probe targets to one or more nodes necessitates moving several others out of the way. Such changes to high-density boards in many cases, may not be practical, as there may not be any room to move traces. If any of the signal traces also happen to be high-frequency signal traces, then the bends needed to re-route them may also have a negative performance impact as well as the negative effects of the conventional target itself.

Figure 1B:
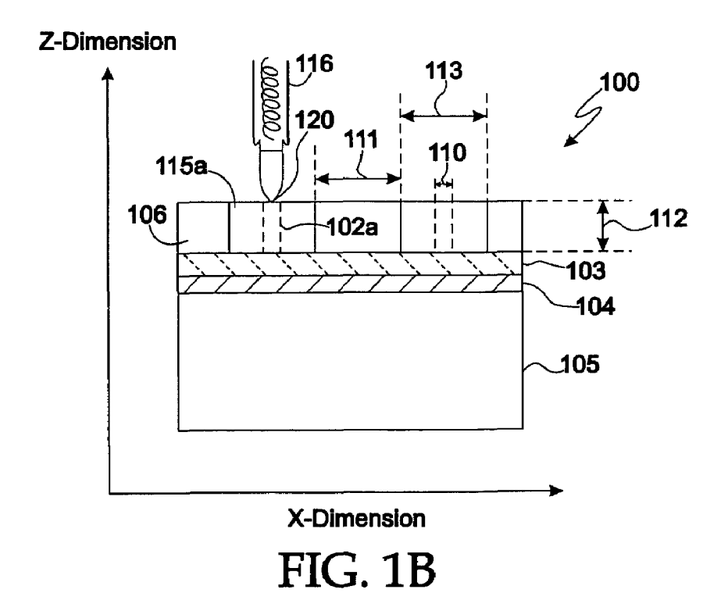
FIG. 1B is a cross-sectional side view of the printed circuit board with differential signal traces showing the x- and z-dimensions in the x-, y-, z-coordinate system.

Additional difficulties arise when testing is considered. Testing requires tester access to circuit traces at particular probe targets. Layout rules typically require test targets to be at least 50 mils apart and may require the diameter of the test point targets to greatly exceed the width of the traces. FIGS. 1A and 1B illustrate test targets 115a, 115b symmetrically positioned 50 mils apart on the differential signal traces 102a, 102b. As seen in FIGS. 1A and 1B, large test targets 115a is being probed by a typical fixture probe 116 with a sharp head 120, such as those available from Interconnect Devices, Inc., 5101 Richland Avenue, Kansas City, Kans. 66106. The sharp probes 116 help break through any oxide or residue build up on the test targets 115a and 115b.

The positioning of test targets 102a, 102b can be problematic. In many cases the need to keep a minimum separation between targets (typically 50 mils, minimum) is in direct conflict with controlled impedance layout rules. These conflicts lead to either a compromise in controlled impedance integrity and optimal circuit layout for performance and space, or a forced reduction in target placement with a resulting reduction in testability.

While high-speed printed circuit boards are one example of layout-critical circuits, another more general case is that of high-density boards. Adding conventional probe targets to a high-density board will most likely disturb the layout. For example, adding test points to just one or more nodes may require moving several other traces out of the way. In many cases, in a high-density circuit design, this may be impractical, if not impossible, as there may not be any room to move these traces in a crowded circuit layout. If any traces are also high-frequency signal traces, then the re-routing may have an additional negative performance impact as well as the negative effects to the optimal circuit layout itself.

As discussed more fully in U.S. patent application Ser. No. 10/670,649 entitled Printed Circuit Board Test Access Point Structures And Methods For Making The Same filed Sep. 24, 2003 by Kenneth P. Parker et al. and U.S. patent application entitled Method And Apparatus For Manufacturing And Probing Printed Circuit Board Test Access Point Structures filed Oct. 25, 2004 by Kenneth P. Parker and shown in FIGS. 2A–2C, a new paradigm has been developed to replace the old test paradigm where large probe targets are laid out on a printed circuit board and probed with sharp-pointed fixture probes mounted in a test fixture.

Figure 2A:
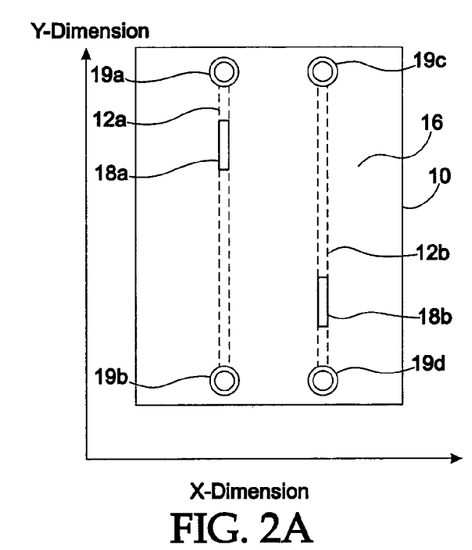
FIG. 2A is a top view of a printed circuit board showing the x- and y-dimensions of the differential signal traces in the x-, y-, z-coordinate system with a test access point structure.
Figure 2B:
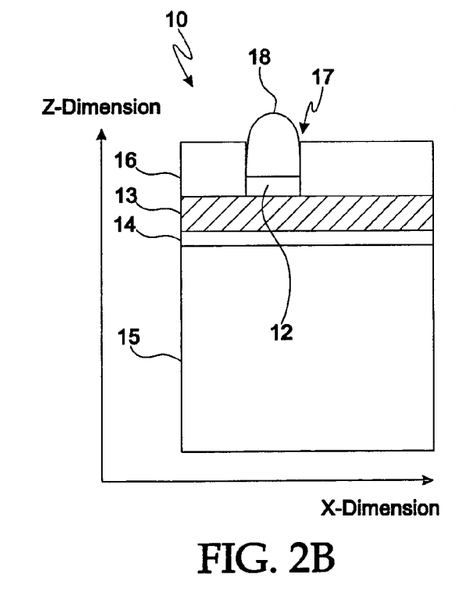
FIG. 2B is a cross-sectional side view of the printed circuit board in FIG. 2A showing the z- and x-dimensions in the x-, y-, z-coordinate system with a test access point structure.
Figure 2C:
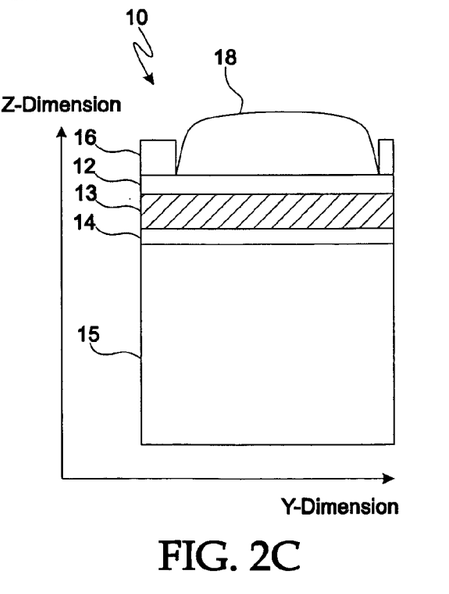
FIG. 2C is a cross-sectional side view of the printed circuit board in FIG. 2A showing the z- and y-dimensions in the x-, y-, z-coordinate system with a test access point structure.

As shown in FIGS. 2A–2C small hemi-ellipsoidal solder beads or test access points 18a and 18b are added to traces 12a and 12b on a printed circuit board 10 without perturbing the board's layout or performance by taking advantage of the z-dimension. As illustrated, the printed circuit board 10 is formed as a plurality of layers. In the illustrative embodiment, the printed circuit board 10 includes a ground plane 14 layered over a substrate 15, a dielectric 13 layered over the ground plane 14, traces 12a, 12b layered over the dielectric 13, a solder mask 16 layered exposed surfaces of the traces 12a and 12b and dielectric 13, and test access points 18a and 18b.

As noted above, an important factor in probing is obtaining a good electrical contact between the fixture probe and the test target. In the old paradigm, this was typically handled by probing with a sharp probe tip 120. However, this method may be problematic with bead probes or test access point structures 18a and 18b, as the test access point structures may have very small dimensions in the x-y plane, in the order of 3–5 mils wide by 15–20 mils long or less. Current design for test guidelines for ICT (in circuit testers) require a minimum 30 mil diameter test pad or target by a chisel or spear tipped probe. The small dimensions of the test access point structures in the x-y plane in combination with the small dimensions of the chisel or spear tipped test fixture probe would very likely create test access accuracy and reliability problems. Simply, it may be hard to hit a small target with a sharp tipped probe with current industry test fixture standards. Also, while a chisel or spear tipped test fixture probe may be effective in disturbing surface contaminants on a 30 mil or greater test pad, assuming it could reliably hit a 3–5 mil test access point structure, it would very likely catastrophically damage the test access point structure. There is a need in the industry for a method to ensure good electrical contact between bead probes or test access point structures and fixture probes.

SUMMARY OF THE INVENTION

The present invention solves the problem of how to obtain a good electrical contact between a solder bead probe or a test access point structure and a fixture probe for printed circuit board testing.

In one embodiment a surface of a solder bead probe may be cleaned by a lateral wiping motion of a wobble fixture probe as the wobble fixture probe is brought into compressive contact with the solder bead probe. In an exemplary method for implementing the wobble fixture probe, a shaft with a contact face on one end and a spring at a second end is attached to a closed end of a barrel; an open end of the barrel is narrowed; and a bulge along an inside wall of the barrel is created.

In an exemplary method for cleaning and probing a solder bead probe on a printed circuit board, a wobble fixture probe is aligned with a solder bead probe and brought into compressive, wiping contact therewith. Testing may then be run with the wobble fixture probe in contact with the solder bead probe.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Turning now in detail to the invention, on a trace defined in an x-, y-, z-coordinate system where the x-dimension represents the trace width, the y-dimension represents the trace length, and the z-dimension represents the trace thickness, it will be recognized by those skilled in the art that present techniques for test access point placement on a printed circuit board utilize only the x- and y-dimensions. The present invention takes a different approach by taking advantage of the z-dimension, that is, the trace thickness. In this regard, the test access point structure of the invention is a localized "high point" on a printed circuit board trace that does not significantly perturb the impedance of the trace and that can be targeted with a probe. Throughout this specification, test access point structure and bead probe structure are used interchangeably.

Figure 3:
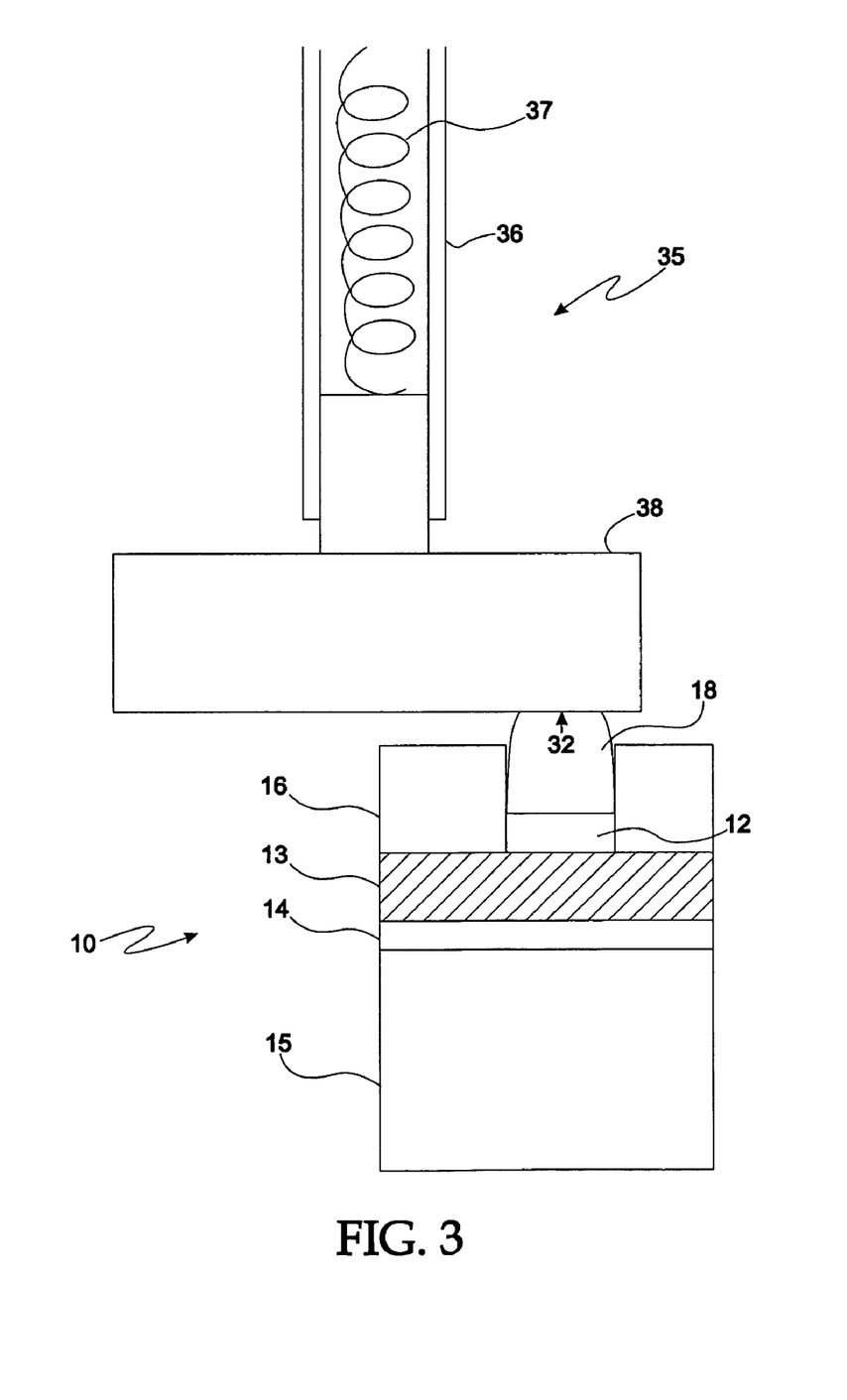
FIG. 3 is a cross-sectional side view showing a portion of a printed circuit board with a test access point structure on a trace and a fixture probe contacting the test access point structure.

As discussed more thoroughly in the above referenced patent applications, FIG. 3 illustrates one potential method to ensure electrical contact between the fixture probe and the test access point structure. FIG. 3 illustrates a side cross-sectional view of a fixture probe contacting a test point access structure in accordance with the invention. As shown in FIG. 3, a printed circuit board 10 comprises a substrate 15, a ground plane 14, and at least one dielectric layer 13 with at least one trace 12 printed, deposited or otherwise attached thereon. A solder mask 16 with a hole formed over the trace 12 at a location where a test access point structure 18 is positioned over the exposed surfaces of the dielectric layer 13 and trace layer 12. Test access point structure 18 is conductively attached to trace 12 within the solder mask hole 17 at the test access point. The test access point structure 18 projects above the exposed surrounding surfaces of the solder mask 16 to form an exposed localized high point on the trace 12 that may be electrically contacted as a test target by a fixture probe 35 during testing of the printed circuit board 10.

As discussed above and shown in FIG. 3, as the fixture probe 35 is brought into initial compressive contact with test access point structure 18, test access point structure will be deformed and form a substantially flat upper surface 32, which will move any potential surface oxide, residues or contaminates and permit a good electrical contact between the fixture probe 35 and the test access point structure 18. The compressive force between the fixture probe and the test access point structure 18 may be from any known means, such as a spring loaded fixture probe 35 with a shaft 36, a spring force mechanism 37 and a substantially flat contact area 38.

For the purposes of discussion, assume the fixture probe has a flat surface that comes in contact with the test access point or bead 18. If the radius of curvature is tight enough, the test access point structure 18 made of solder is subject to deformation when a fixture probe contacts it with a predetermined amount of force. A typical fixture probe force is approximately 4–8 ounces. The yield strength of typical solders (both leaded and lead-free) is approximately 5000 psi. Thus, when a fixture probe compressively contacts a newly formed bead or test access point 18 for the first time, the test access point 18 will deform with a substantially flattened top, as shown in FIG. 3. The flat area 32 grows as the solder deforms, until the flat area 32 is great enough to support the fixture probe force. The process of deforming the bead or test access point 18 displaces any surface oxides, contaminants or residues and gives the fixture probe excellent electrical contact to the solder of the test access point 18.

By way of analogy, one can think of a potato as a bead probe and the potato skin as surface contaminates, residues or oxides. The potato is placed on a flat, hard surface. A second object, representing a fixture probe, having a flat, hard surface with a diameter at least as large as that of the potato is brought into compressive contact with the potato until the surface of the potato begins to deform and flatten. As this happens, the potato skin will be deformed and the flat surface of the second object, representing the fixture probe will come into contact with the inside of the potato, representing uncontaminated solder of the bead probe.

As an exemplary model, the yield strength of solder is approximately 5000 psi or 0.005 pounds per square mil, or 0.08 ounces per square mil. Thus, to support a typical 4-ounce flat probe, the flattened area 32 of the test access point 18 must be 4/0.08 or 50 square mils. Assume a 5 mil wide by 20 mil long bead 18 that is approximately 3 mils high. Assume that when the fixture probe first touches the bead 18, there is no flattened surface area. Then as the fixture probe pushes down on the solder, the area that is flattened 32 approximates an ellipse with a 1:4 width/length ratio. As this area increases, the solder yield begins to slow until there is a "footprint" of 50 square mils, or about ½ the total area of the bead itself. Once the surface area is large enough to support the fixture probe force, no further deformation occurs. Subsequent probing does not produce any further deformation.

Once probing has flattened a bead probe, the solder bead is subject to growing a new layer of oxide coating or other surface contaminants as time passes. Therefore, if the board is returned from the field for re-test or if the board had to pass through a repair and re-test cycle, there may be a new oxide or contaminant layer on the surface of the bead probe 18. Since the flattened bead is already capable of supporting the probe force, no new deformation should occur to displace this oxide or contaminant layer. While lead-free solder (containing a majority of tin) may grow a conductive tin-oxide layer, older leaded solder may grow a lead-oxide layer that is a poor conductor. Thus, this oxide layer or other surface contaminants may adversely affect re-testing.

Figure 4A:
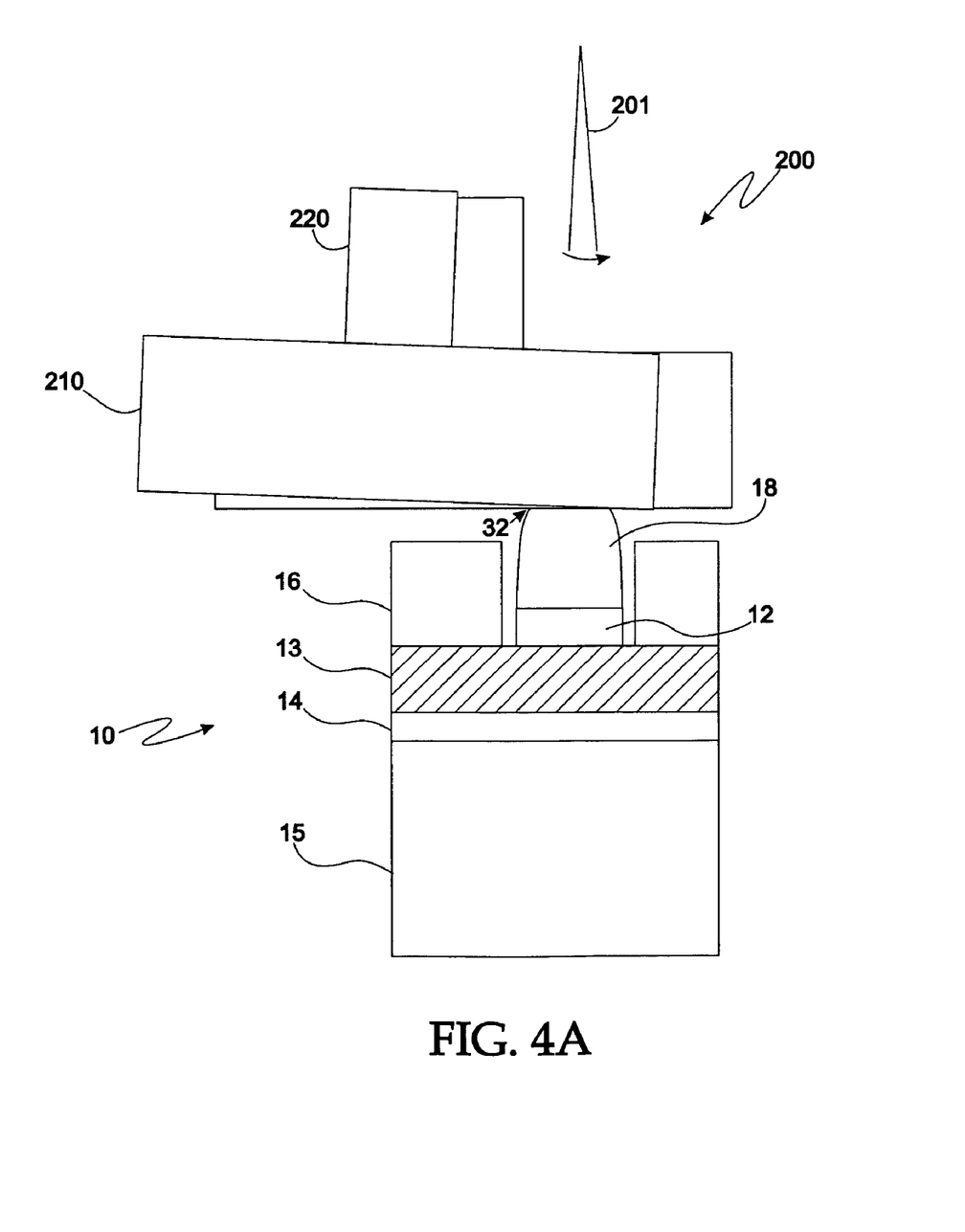
FIG. 4A is a cross-sectional side view showing a portion of a printed circuit board with a test access point structure on a trace and a wobble fixture probe laterally wiping a top surface of the test access point structure in accordance with the invention.

This problem may be addressed by using a smooth faced wobble fixture probe that laterally wipes across a top surface of a bead probe 18. FIG. 4A illustrates a wobble fixture probe 200 wiping across top surface of a bead probe or test access point structure 18 on a printed circuit board 10 in accordance with the invention. As the wobble probe 200 is depressed inside its rifled barrel, an internal spring and indentation, bulge or other similar mechanism causes it to wobble or laterally wipe across the surface of the bead probe 18. This causes the wobble fixture probe 200 to move laterally a predetermined distance as it contacts the bead probe 18, which causes a wiping action that polishes the bead probe surface 32 clean of any oxide, residue or contaminant buildup. The wobble fixture probe 200 may have a relatively flat or smooth faced tip 210, because at a microscopic scale this is actually a rough surface that grinds the oxide, residue or contaminants off the bead probe surface 32, restoring adequate electrical contact between the bead probe 18 and the wobble fixture probe 200.

As seen in FIG. 4A, the probe 200 starts off in a position that is angularly offset from true vertical (the angular offset is exaggerated). As the probe 200 is depressed, that angular offset is slowly removed as a spring force increases on the bead probe 18. Near the point of optimal probe depression travel (typically approximately ⅔ of its maximum travel), the probe 200 is "bumped" into vertical compliance, thus wiping the surface of the bead probe 18 while under optimal pressure.

Figure 4B:
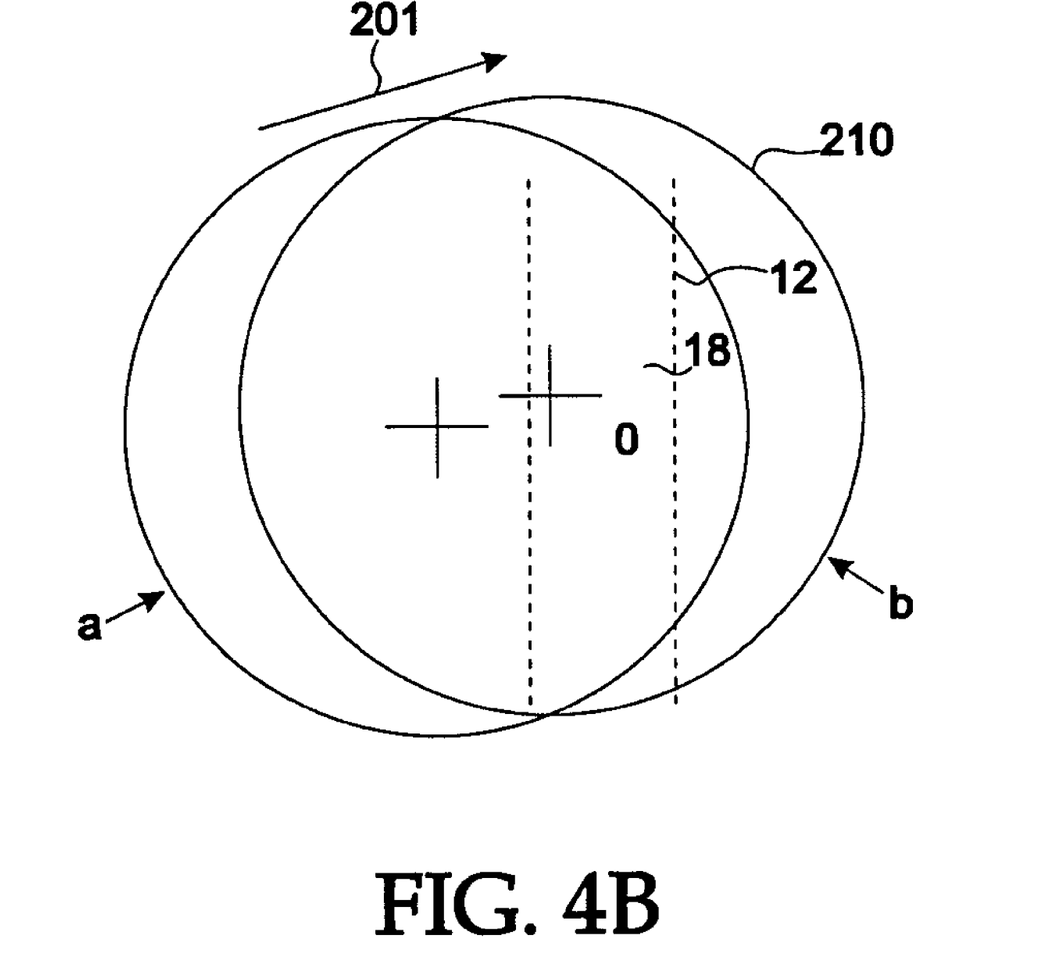
FIG. 4B is a top view of a test access point structure with a wobble fixture probe in a wiping motion imposed there over in accordance with the invention.

FIG. 4B illustrates a top view of bead probe 18 on a trace 12 with probe tip 210 superimposed thereon, illustrating the wiping action as fixture probe 200 is brought into compressive contact with bead probe 18. FIG. 4B is shown with some misalignment between the bead probe 18 and the fixture probe tip 210, illustrating that for a bead probe 18 of approximately 3–mils by approximately 15–20 mils and a fixture probe tip 210 with a diameter of approximately 23–35 mil will accommodate some system misalignment.

Figure 5:
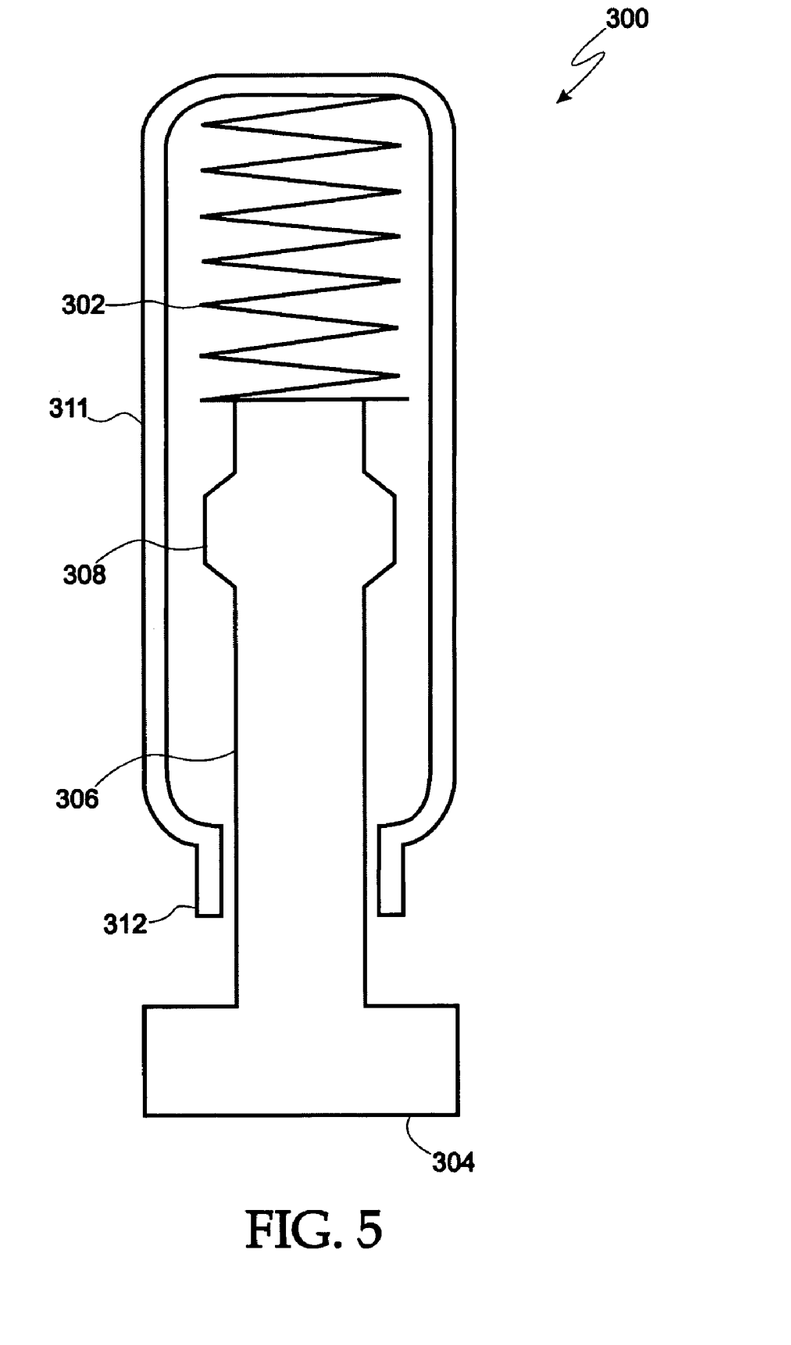
FIG. 5 is a cross-sectional side view of a typical fixture probe.

FIG. 5 illustrates a typical fixture probe 300 utilizing typical fixture probe construction techniques. Specifically, a typical fixture probe has a plunger 306 with a contact head 304 and a retainer in a barrel 311 that encloses the plunder shaft 306 and a spring 302 that supplies the compressive force during contact with a test target. The barrel 311 is crimped at the bottom 312 to decrease its diameter. The probe shaft has a wide portion 308 that acts as a retainer that cannot pass the crimped portion 312 of the barrel 311, thereby keeping the shaft 306 inside the barrel 311. The spring 302 is under compression at all times, and is designed to meet a specified spring force when the probe shaft 306 is about ⅔ depressed into the barrel 311. Such an ideal probe 300 will stand substantially straight and maintains contact with the barrel 311 via the conductivity of the spring 302. The barrel 311 is connected to the tester electronics (not shown).

Figure 6:
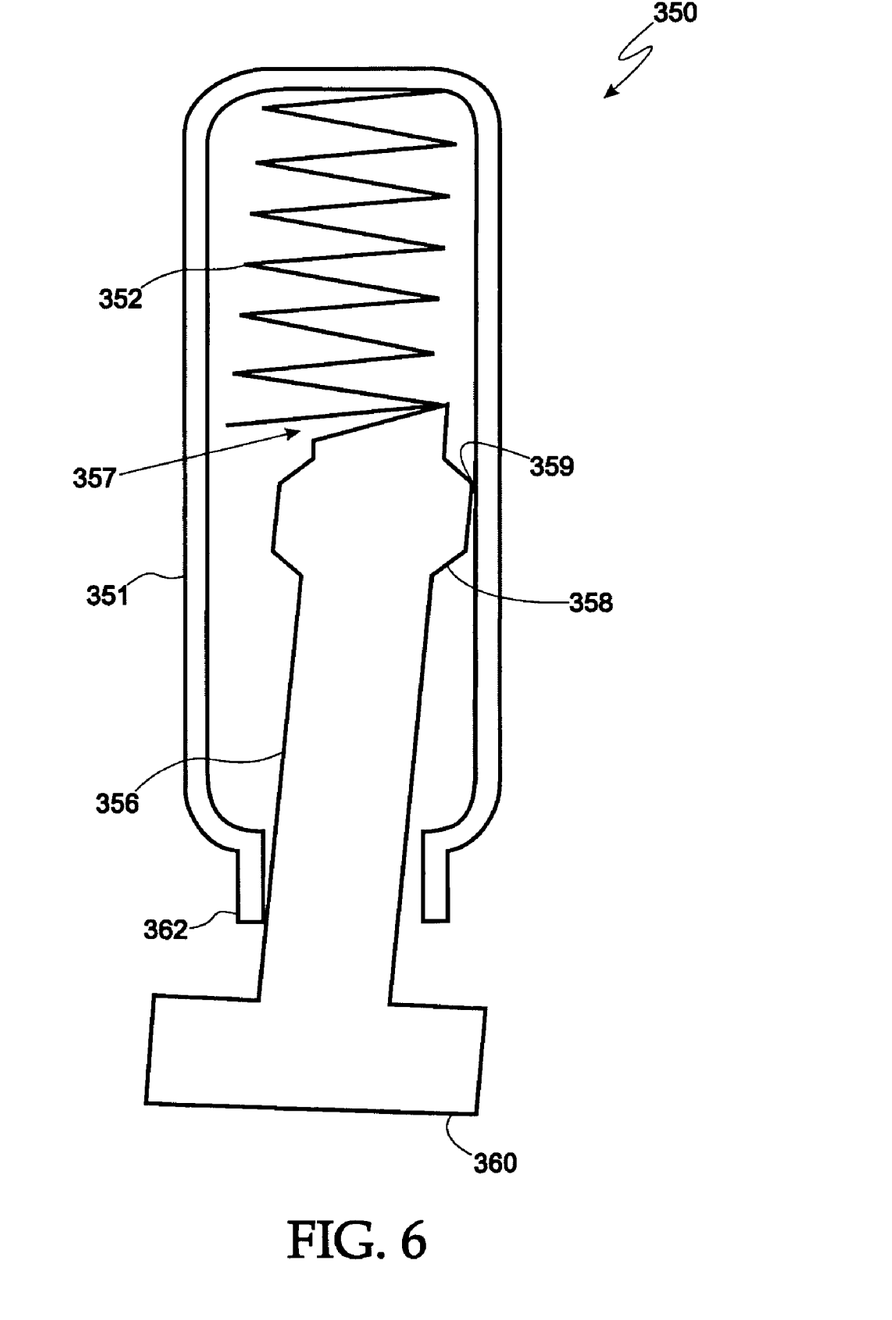
FIG. 6 is a cross-sectional side view of a bevel biased fixture probe.

However, good spring conductivity may not be desirable in practice. A good connection from the barrel to the probe shaft is desirable, so some probe designs deliberately force the probe shaft to rest against the barrel, making contact in two places. FIG. 6 illustrates such a biased fixture probe 350, in which the top of the shaft 356 beveled 357 and bending the spring 352, so that the probe shaft 356 rest against the side of the barrel 351 at 359, causing offset bias on the probe (note the angular offset is exaggerated). Other methods of producing this bias may exist. As a bias probe 350 is depressed, the shaft retainer 358 will scrape its way down the side of the barrel 351, and the lower region of the shaft 356 will scrape against the barrel crimp 362. This helps remove any contaminants or oxides and maintain good contact between the probe shaft 356 and the barrel 351.

An undesirable consequence of bias probes, and other tolerance errors in the construction of a probe is called a pointing error. Fixture probes are normally intended to hit a probe target on a board and an excessive pointing error may cause the probe to miss the target. With bead probes or test access points, the fixture probe is now the target, but an excessive pointing error can still cause a miss. The pointing error can be calculated as illustrated in FIG. 7.

Figure 7:
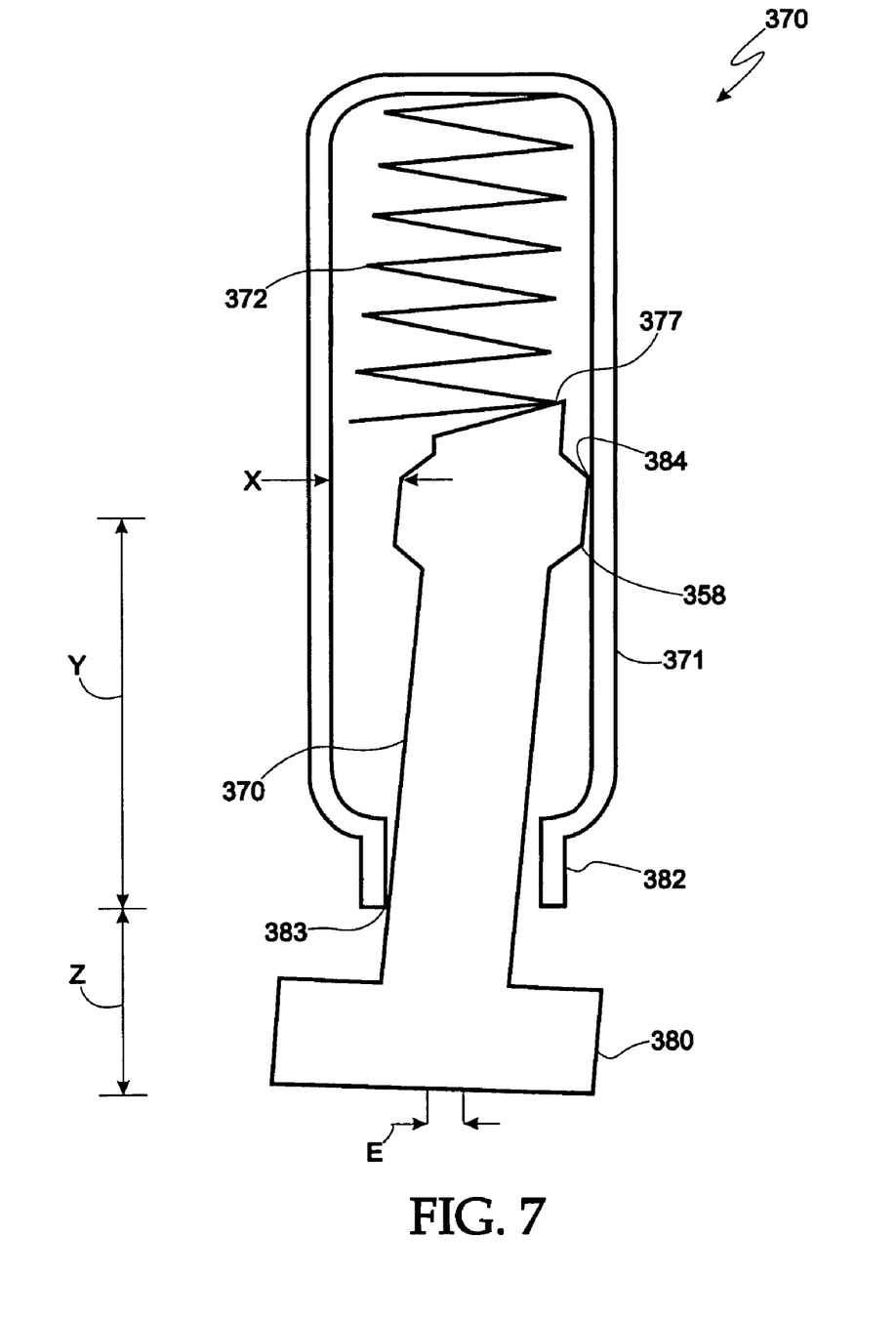
FIG. 7 is a cross-sectional side view of a biased fixture probe illustrating pointing error.

As shown in FIG. 7, the pointing error $E=+/-X(Z/Y)$. It will be noted that the values of Y and Z will change as the probe 370 is depressed. Z will get smaller and Y will get larger. The pointing error E will decrease as the probe 370 is depressed in the barrel. This means the probe head will move across the surface of the bead probe 18 as the probe 370 is displaced. Thus, the present invention may utilize pointing error of a bias fixture probe to effect a wiping action on a bead probe 18.

Figure 8A:
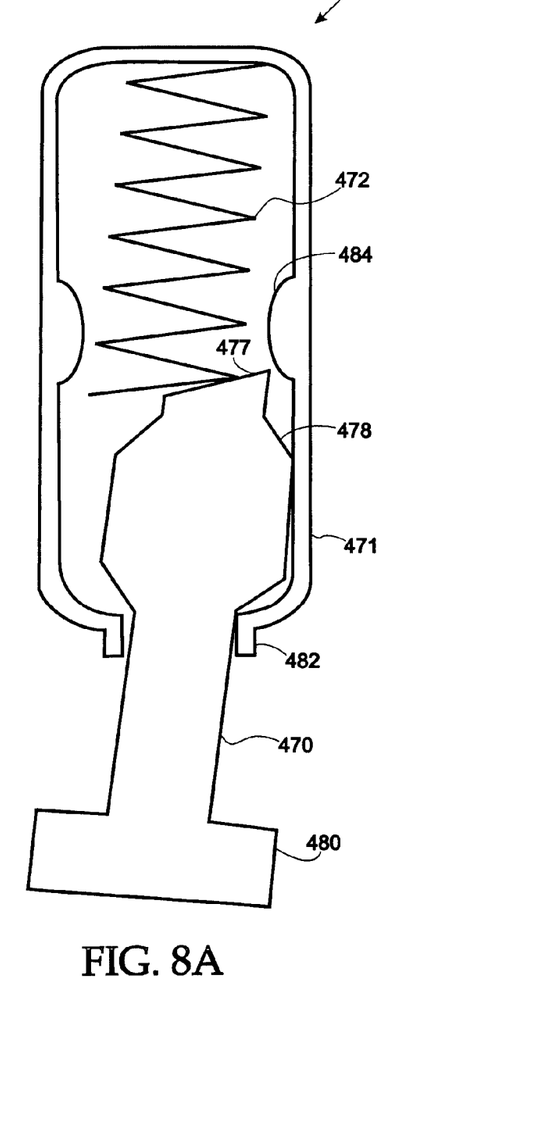
FIG. 8A is a cross-sectional side view of a wobble fixture probe with a barrel wall bulge in a non-contact position in accordance with the invention.
Figure 8B:
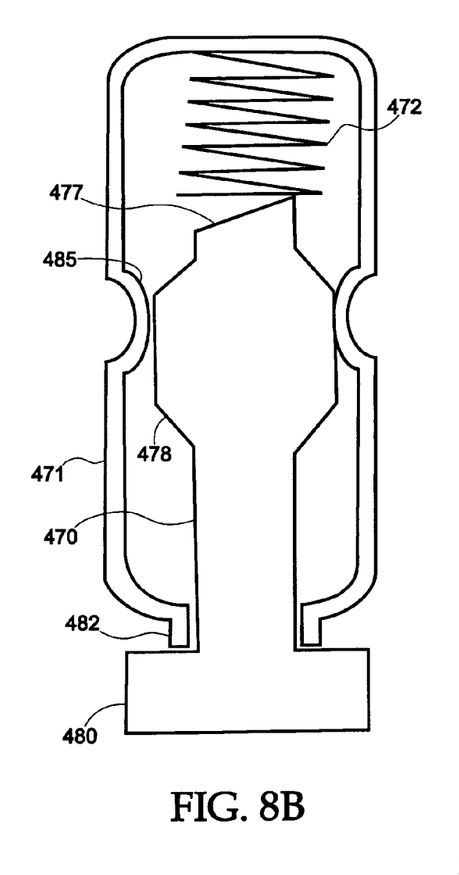
FIG. 8B is a cross-sectional side view of a wobble fixture probe with a barrel wall bulge in a depressed position in accordance with the invention.

FIGS. 8A and 8B illustrate a wobble probe 400 according to the invention. Wobble probe 400 has a shaft retainer 478 designed to bump into a barrel wall bulge 484 and 485 after travel begins. The bulge 484 and 485 significantly reduces the working travel X seen in FIG. 7. The bulge 484 and 485 causes the shaft 470 to sharply straighten its travel, which will cause the probe face 480 to move laterally (as seen in FIGS. 4A, 4B, 9A, 9B and 9C. The movement occurs after the probe face first contacts the bead probe 18, and before full travel occurs for maximum wiping. The barrel 471 may be made wider between the crimp 482 and the bulge 484 and 485 to exaggerate the bias when the shaft 470 is not depressed, thus increasing the wiping effect as the shaft 470 is engaged and depressed.

The barrel wall bulge 484 and 485 may be made inexpensively, such as by crimping the wall 471 at the same time the bottom crimp 482 is made. This is shown in FIG. 8B as 485. Alternatively, it may be made as part of the mold used to create the barrel originally, as shown as 484 in FIG. 8A. If desired, the direction of travel can be fixed by attaching the spring 472 to the top of the barrel 471, thus fixing its bias. However, the direction of wiping is not important, so this step may be omitted.

The barrel wall bulge 484 and 485 extends a full 360 degrees around the barrel. However, by fixing the base spring, thus guaranteeing its orientation, one may use a bump on one side of the barrel 471 or simply a dent or crimp rather than a dull circle, if desirable or less expensive.

Figure 9A:
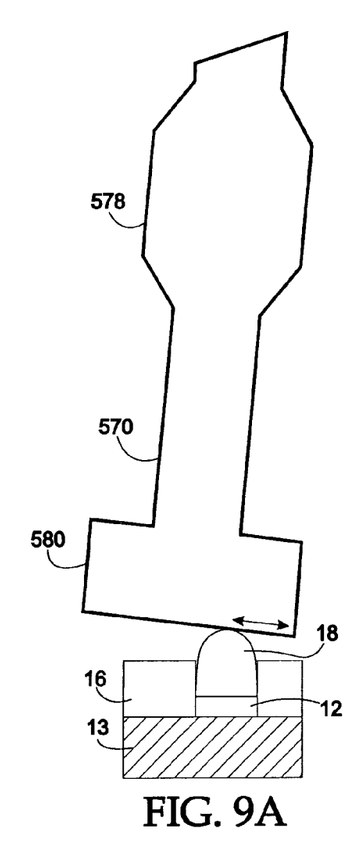
FIG. 9A is a cross-sectional side view of a wobble fixture probe upon first contacting a test access point during probing in accordance with the invention.
Figure 9B:
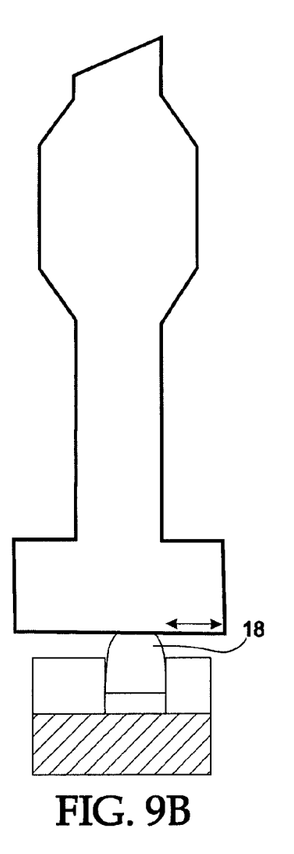
FIG. 9B is a cross-sectional side view of a wobble fixture probe at a final contact position with a test access point during probing in accordance with the invention.
Figure 9C:
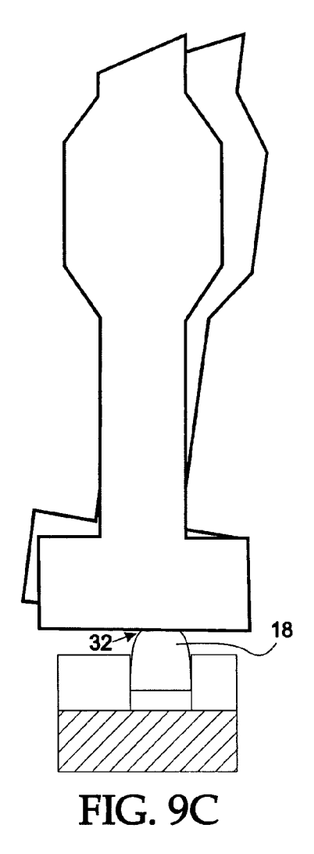
FIG. 9C is a cross-sectional side view of a wobble fixture probe at a final contact position with a test access point overlapped with a view at first contact during probing in accordance with the invention.

FIGS. 9A, 9B and 9C illustrate the wiping action of a wobble probe as it is brought into contact (FIG. 9A) with a bead probe 18 and compressed to its optimal travel point (FIG. 9B). FIG. 9C illustrates the wobble probe at its optimal travel point superimposed over it initial contact point to illustrate the lateral wiping motion that occurs to the top surface of the bead probe 18, thus cleaning the surface of the bead probe 18 of any contaminants, oxides or residues and ensuring a good electrical contact between the bead probe 18 on trace 12 of printed circuit board 10 and the fixture probe. The contact face 580 may be relatively smooth or flat, as at a microscopic level, it will be rough and sufficient for wiping contaminants from the bead probe 18. The contact face 580 may be a relatively circular face with a diameter or 23–35 mil.

It should be noted that the size and location of the wall bulge may be used to determine when the lateral wiping motion begins and the extent of the lateral motion. Likewise, the size, length and placement of the shaft retainer may be used to determine when the lateral wiping motion begins and the extent of the lateral wiping motion. Also, the width of the wall above the bulge may be widened to accentuate the amount of wiping motion.

Figure 10:
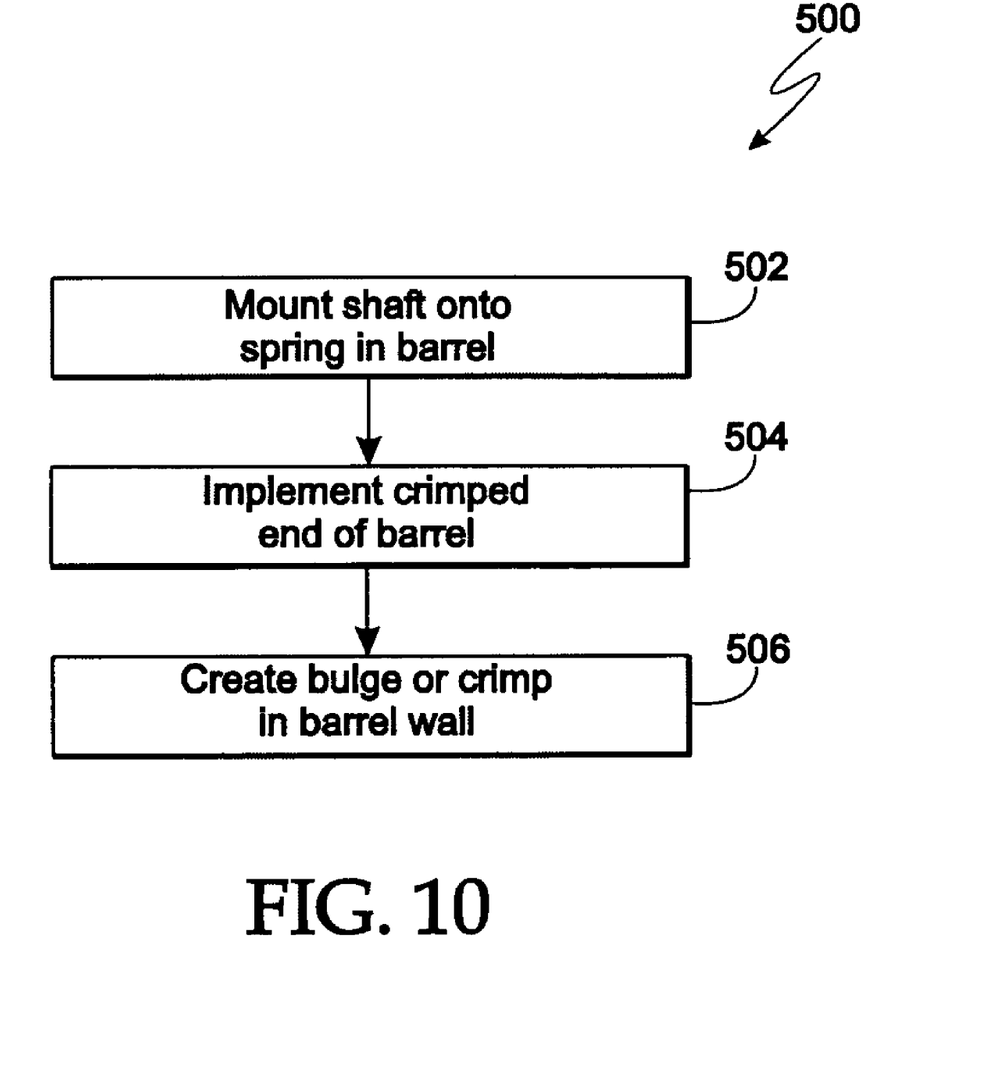
FIG. 10 is an operational flow chart illustrating a method for implementing a wobble fixture probe in accordance with the invention.

FIG. 10 is an operational flow chart 500 for a method of implementing a wobble fixture probe according to the invention, in which a relatively flat contact member on a shaft with a retainer section is mounted on a spring in a barrel at step 502. In step 504, the open end of the barrel is crimped or otherwise narrowed to retain the shaft with the contact member extending form the open crimped end of the barrel and the other end of the shaft in contact with the spring at the closed end of the barrel. In step 506, the bulge or crimp in the barrel wall is implemented. This may be done when the barrel is made, as parting of a molding process or later as a crimping step when the open-end crimp is implemented.

Figure 11:
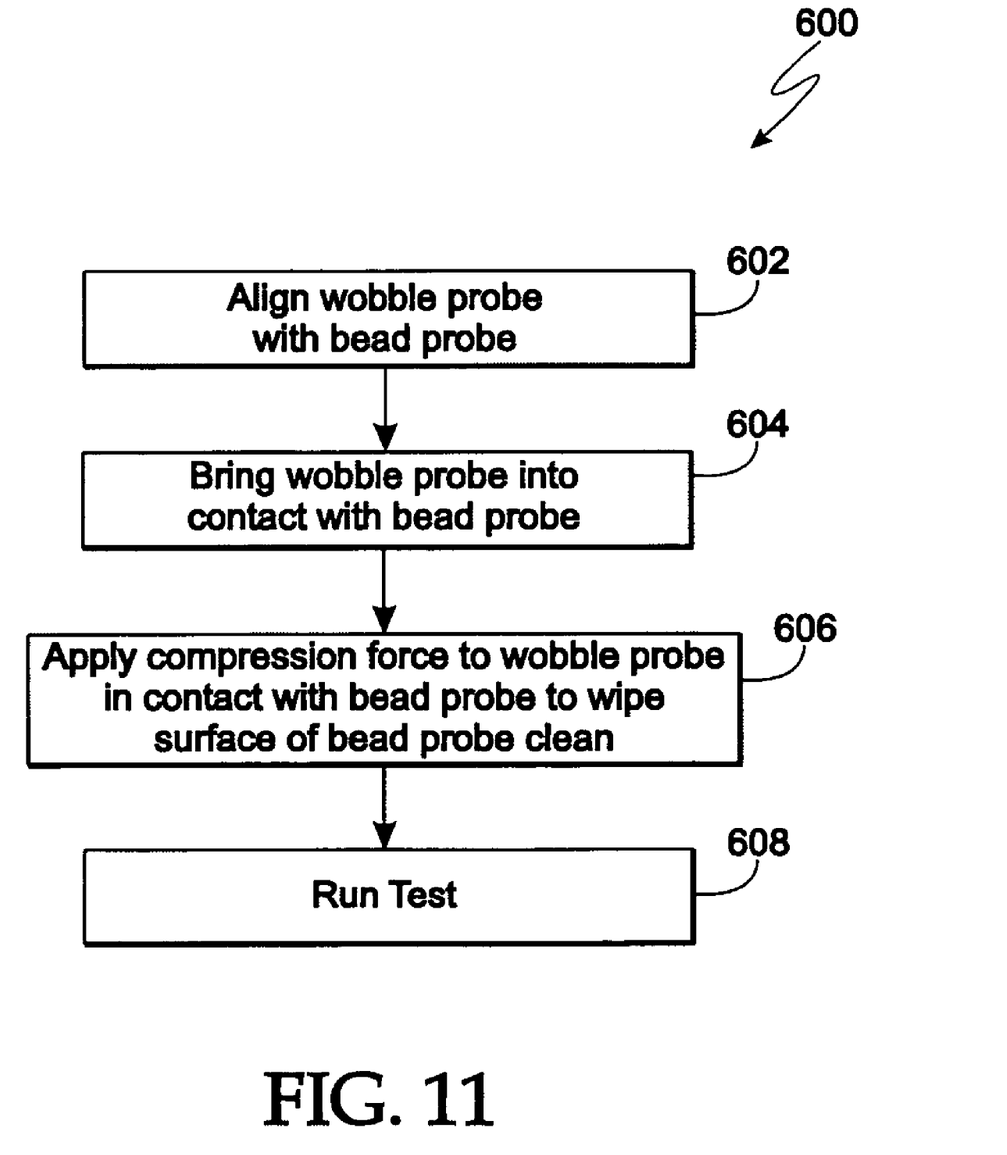
FIG. 11 is an operational flow chart illustrating a method of testing a test access point structure on a trace of a printed circuit board with a wobble fixture probe in accordance with the invention.

FIG. 11 is an operation flow chart for a method 600 of probing a bead probe with a twisting fixture probe in accordance with the invention. In operation, a wobble fixture probe in a test fixture is aligned with a test access point structure 18 on a trace 12 of a printed circuit board 10 at step 602. A substantially flat contact face of the wobble fixture probe is brought into contact with a top surface of a test access point structure 18 at step 604. Electrical contact is ensured as the top surface 32 of test access point structure 18 is cleaned of any oxides, residues or contaminants as the substantially flat contact face is wiped across the test access point structure 18 by applying a compressive force to a shaft of the wobble probe at step 606. After electrical contact is ensured, tests requiring electrical contact between the test access point structure 18 and the fixture probe may be run at 608.

It will be appreciated from the above detailed description of the invention that the present invention uniquely solves the conflict problems faced by traditional techniques for test access point placement on printed circuit boards. Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, the tip of the wobble fixture probe may be a shape other than circular, as shown in FIG. 4B. Also, bead probes may be implemented on either or both sides of a two-sided printed circuit board. It is also possible that other benefits or uses of the currently disclosed invention will become apparent over time.

What is claimed is:

1. A method for probing a solder bead probe on a printed circuit board, said method comprising:

aligning a wobble fixture probe with a solder bead probe conductively attached to a trace on a printed circuit board, the solder bead probe comprising a localized high point of solder along the trace of the printed circuit board, and the wobble fixture probe comprising a barrel forming a sleeve around a shaft, the shaft having a first end connected to a contact tip and a second end connected to a compressive force mechanism retained within the barrel, and a retainer mechanism along the shaft which retains the shaft within the barrel, the barrel having a bulge in the wall of the barrel;

bringing the contact tip of the wobble fixture probe into compressive contact with the solder bead probe such that the retainer mechanism contacts the bulge in the barrel as compressive force is applied to the contact tip, causing the shaft to wobble and the contact tip to move in a lateral wiping motion against the solder bead probe.

2. The method of claim 1, further comprising the step of running one or more tests with the wobble fixture probe in compressive contact with the solder bead probe.

3. The method of claim 1, wherein the contact tip of the wobble fixture probe is substantially flat.

4. The method of claim 1, wherein the contact tip of the wobble fixture probe is substantially flat at the surface that contacts the solder bead probe.

5. The method of claim 4, wherein the contact tip of the substantially flat wobble fixture probe is substantially circular.

6. The method of claim 5, wherein the diameter of the substantially circular contact tip of the substantially flat wobble fixture probe is appmximately 23–35 mil in diameter.

\* \* \* \* \*

UNITED STATES PATENT AND TRADEMARK OFFICE
CERTIFICATE OF CORRECTION

PATENT NO. : 7,161,369 B2 Page 1 of 1
APPLICATION NO. : 10/978100
DATED : January 9, 2007
INVENTOR(S) : Parker et al.

It is certified that error appears in the above-identified patent and that said Letters Patent is hereby corrected as shown below:

In column 10, line 30, in Claim 6, delete "appmximately" and insert -- approximately --, therefor.

Signed and Sealed this

First Day of May, 2007

JON W. DUDAS
*Director of the United States Patent and Trademark Office*